United States Patent
Fuergut et al.

(10) Patent No.: US 8,815,651 B2
(45) Date of Patent: Aug. 26, 2014

(54) METHOD FOR MANUFACTURING AN ELECTRONIC DEVICE BY REDUCING THICKNESS OF ELECTRONIC MEMBERS ATTACHED TO A CARRIER

(75) Inventors: Edward Fuergut, Dasing (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 291 days.

(21) Appl. No.: 13/340,770

(22) Filed: Dec. 30, 2011

(65) Prior Publication Data

US 2013/0168870 A1 Jul. 4, 2013

(51) Int. Cl.
*H01L 21/00* (2006.01)
*H01L 21/30* (2006.01)
*H01L 21/46* (2006.01)

(52) U.S. Cl.
USPC .......................... 438/127; 438/121; 438/459

(58) Field of Classification Search
None
See application file for complete search history.

(56) References Cited

U.S. PATENT DOCUMENTS

| | | | | |
|---|---|---|---|---|
| 6,582,991 B1 * | 6/2003 | Maeda et al. | ................ | 438/107 |
| 7,129,110 B1 * | 10/2006 | Shibata | ................ | 438/106 |
| 7,968,378 B2 | 6/2011 | Mahler et al. | | |
| 7,982,309 B2 | 7/2011 | Vervoort et al. | | |
| 2007/0145555 A1 | 6/2007 | Fuergut et al. | | |
| 2007/0278653 A1 | 12/2007 | Brunnbauer et al. | | |
| 2009/0039496 A1 | 2/2009 | Beer et al. | | |
| 2010/0001414 A1 * | 1/2010 | Mahler et al. | ................ | 257/784 |
| 2010/0244235 A1 * | 9/2010 | Kapusta et al. | ................ | 257/698 |
| 2011/0316146 A1 * | 12/2011 | Pagaila et al. | ................ | 257/737 |

FOREIGN PATENT DOCUMENTS

| | | |
|---|---|---|
| DE | 10334576 A1 | 4/2007 |
| DE | 102006025671 A1 | 12/2007 |
| DE | 102007040149 A1 | 2/2009 |

OTHER PUBLICATIONS

Fuergut et al, Taking Wafer Level Packaging to the Next Stage: A 200 mm Silicon Technology Compatible Embedded Device Technology, Semicon Europa 2006 Conference, Apr. 4, 2006. pp. 1-17.
Edward Fuergut, eWLB Reconstitution, From Idea to Volume Production, Semicon Europa 2010 Converence, Oct. 20, 2010. pp. 1-22.

* cited by examiner

*Primary Examiner* — Michael Jung

(57) ABSTRACT

A method for manufacturing an electronic interconnect device is described, the method comprising: providing an electronic members each having one or more electrical contacts on a first member side thereof; providing a carrier having a carrier base and having sets of one or more electrically conductive projections on a surface of the carrier base; attaching the electronic members with the corresponding contacts thereof to the respective set of projections to thereby electrically connect the one or more electrical contacts of the respective chip with the corresponding one or more electrically conductive projections of the respective set; encapsulating exposed portions of the electronic member with an encapsulating material to form an encapsulation.

14 Claims, 9 Drawing Sheets

METHOD FOR MANUFACTURING AN ELECTRONIC DEVICE BY REDUCING THICKNESS OF ELECTRONIC MEMBERS ATTACHED TO A CARRIER

TECHNICAL FIELD

Embodiments generally relate to a device and a method for manufacturing an electronic device or electronic interconnect device.

BACKGROUND

Electronic interconnect devices are usually manufactured on a wafer level (frontend processes) and then the individualized elements are connected to a periphery via housing technology (backend processes). This way of proceedings provides an enlarged process chain including many different process steps which are usually carried out sequentially causing increased costs. Further, in case of thin chips or ultra thin chips (for example, chip thickness<60 µm) the chips are sensitive regarding handling and soldering since they may easily break or bend.

Accordingly, a method of manufacturing electronic devices, which avoids or at least abates the above mentioned inconveniences, is desirable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIGS. 4A', and 4B' and 4B" show product stages similar as FIGS. 4A and 4B, respectively, for explaining further possible embodiments.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

According to an embodiment, a method for manufacturing an electronic device, may generally include providing electronic members each having one or more electrical contacts on a first member side thereof; providing a carrier having lower carrier base and an upper surface above the carrier base; attaching the electronic members with the first member side thereof to the upper surface of the carrier; providing sets of one or more electrically conductive terminals, respectively assigned to the electronic members, wherein the electrical contacts of the respective electronic member are correspondingly electrically connected to the electrically conductive terminals of the correspondingly assigned set of electrically conductive terminals; encapsulating exposed portions of the electronic members with an encapsulating material to form an encapsulation; reducing the electronic members, when being attached to the carrier, in thickness; and, optionally, removing the carrier base (for example, partially or completely removing the carrier base) such that the electrically conductive terminals remain as or are exteriorly accessible as contact terminals for external electrical connection of the electronic device.

Figure 1:
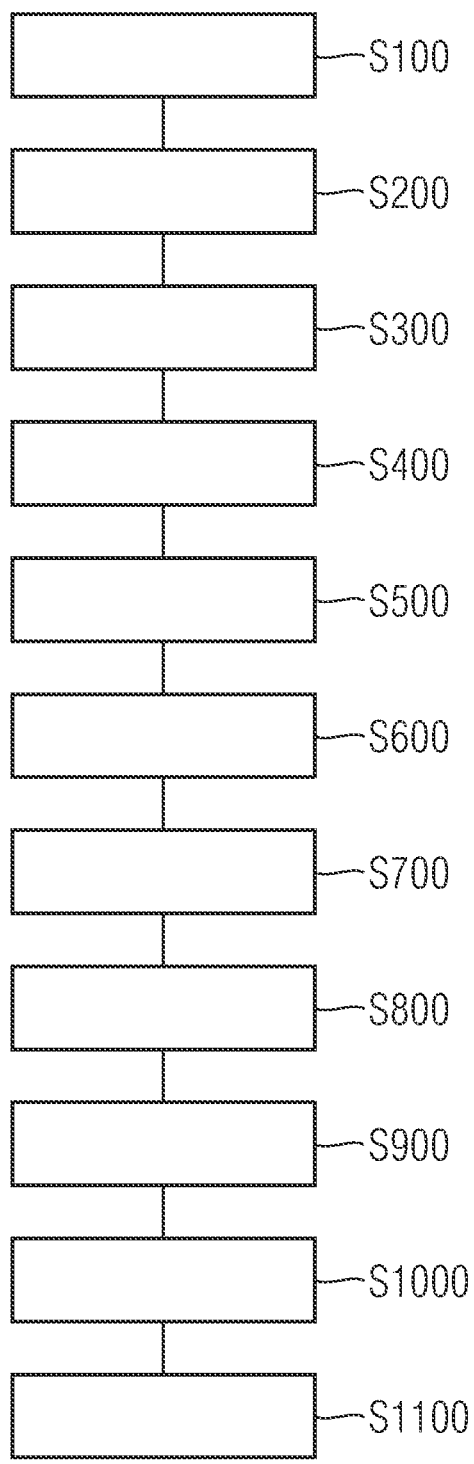
FIG. 1 shows a schematic flow chart describing a process for manufacturing an electronic device according to an embodiment.

The electrically conductive terminals may be provided by means of projections formed on the carrier as described further below with reference to FIGS. 1-2H, or may be provided in a manner so as to extend through holes or vias provided through the carrier at positions aligned to the electrical contacts on the first side of the electronic members.

The carrier may be provided with the through holes before or after placing the electronic members on the carrier, wherein the through holes may be formed by etching, drilling, cutting, such as laser cutting, or by any other appropriate process. As discussed further below with reference to FIGS. 3 and 4A-4J, the carrier may be provided with sacrifice portions provided in a pre-determined pattern so as to be assigned to the electrical contacts of the electronic members to be placed and attached on the carrier, wherein the through holes may be formed by removing, for example by means of etching, the sacrifice portions from the carrier after having the electronic members attached to the surface of the carrier with the electrical contacts thereof being aligned with the sacrifice portions. The electrically conductive terminals provided through the through holes may be wires guided through the through holes and attached to the electrical contacts, for example via soldering. The electrically conductive terminals provided through the through holes may also be formed in the through holes by means of a galvanization process.

Electrically conductive terminals may also be formed, for example in a manner as described above, in areas of carrier laterally outside of the electronic members. Such electrically conductive terminals may be used to be electrically conducted to electrical contacts on the second side (back side) of the electronic members placed on the upper surface of the carrier.

With reference to FIGS. 1 and 2A to 2H, according to a method for manufacturing an electronic device or electronic devices (see FIG. 2H) 1, for example an electronic interconnect device or electronic interconnect devices, such as one or more semiconductor interconnect devices, e.g. one or more transistors (e.g. including one or more field effect transistors (e.g. one or more Metal Oxide Semiconductor (MOS) transistors), one or more bipolar transistors (e.g. one or more Insulated-Gate Bipolar transistors (IGBT)), and the like), one or more power devices such as e.g. one or more power transistors and/or one or more thyristors, one or more power amplifier devices, and the like, there are provided (S100) a plurality of electronic members 2, 4, for example in form of chips (also referred to as dies), for example semiconductor chips, e.g. silicon chips, each having one or more electrical contacts 6, 8 and 10, 12, respectively, on a first electronic member side 14 and 16 (here, first chip side), respectively, thereof, for example source and gate contacts (in the case of a, and each having one or more electrical contacts 18 and 20, for example a drain contact or drain contacts (in the case of a field effect transistor, for example), respectively, on a second electronic member side 21, 22 (here, second chip side) thereof, for example a respective drain contact. Other chip types may be used, for example a chip having one or more electronic interconnect devices as described above. In various embodiments, a logic chip or a memory chip or a chip including a logic portion and a memory portion, may be provided.

Further, there is provided (S200) a carrier 24 having a (lower) carrier base 26 and having sets 28, 30 of one or more electrically conductive terminals, here in form of one or more electrically conductive projections 28', 28", 28'" and 30', 30", 30'", on a (an upper) surface 31 (, above the carrier base 26,) of the carrier 24. In this case, the carrier base 26 is a continuous carrier base 26, that is, it is of a continuous material, for example of a continuous band or continuous sheet material. Further in this case, the electrically conductive projections 28,', 28", 28'", 30', 30", 30'" are in one-piece configuration with the carrier base 26, and the carrier base 26 is of the same electrically conductive material as the projections 28,', 28", 28'", 30', 30", 30'" formed thereon. The material of the carrier base 24 and/or the projections 28,', 28", 28'", 30', 30", 30'" thereon may, for example, be a metal material.

The respective set of projections 28, 30 is assigned to a respective one of the electronic members 2 and 4, wherein the projections 28,', 28", 28'", 30', 30", 30'" of the respective set of projections 28, 30 are arranged in a configuration or pattern which mates to a configuration or pattern of the electrical contacts 6, 8 and 10, 12, respectively, on the first electronic member side 14, 16 of the respectively assigned electronic member 2 and 4.

The electronic members 2, 4 and the correspondingly assigned set of projections 28, 30 may be arranged on the carrier 24 in a single line one after the other, or may be arranged in an array having a structured pattern or may be arranged at arbitrary positions.

The electronic members 2 and 4 are placed (S300) with their corresponding electrical contacts 6, 8 and 10, 12, respectively, aligned to or mating with the respective set of projections 28, 30 to thereby electrically connect the one or more electrical contacts 6, 8, 10, 12 of the respective electronic member 2, 4 with the corresponding one or more electrically conductive projections 28,', 28", 28'", 30', 30", 30'" of the respective set of projections 28, 30. In this case (cf. FIG. 2B), the electronic members 2 and 4 are attached (S400) to the corresponding set of projections 28, 30, for example, via a soldering creating a respective solder layer 32, 34 between the projections 28,', 28", 28'", 30', 30", 30'" and the electrical contacts 6, 8, 10, and 12.

Figure 2A:
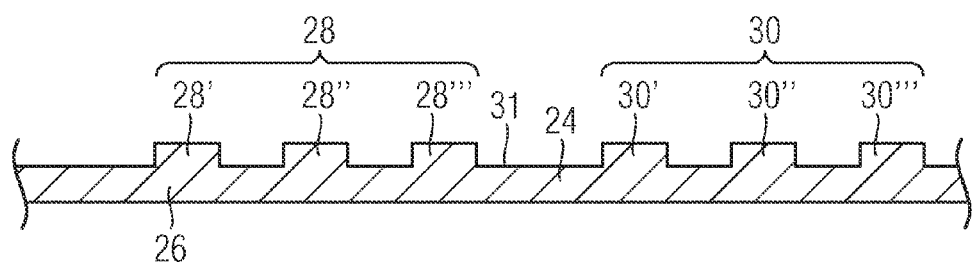
FIGS. 2A-2H show product stages related to the corresponding process stages as described on the basis of FIG. 1.
Figure 2B:
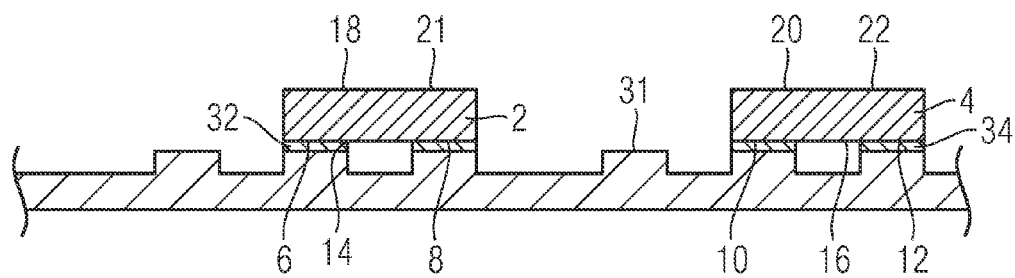
Figure 2C:
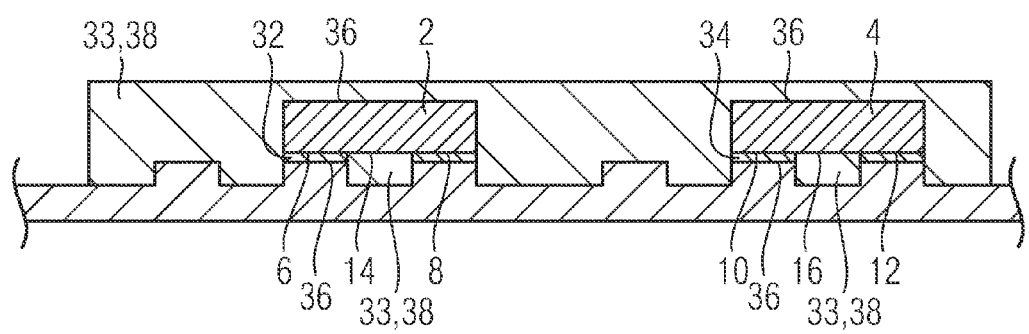

As can be seen from FIG. 2C, an encapsulating material 33 may be applied such as to encapsulate (S500) exposed portions 36 of the electronic members 2, 4 (incl. the solder layers 32, 34) to form a corresponding encapsulation 38 therearound. The encapsulating material 33 may be a dielectric material such as e.g. epoxy molding compound, filled with silica and/or alumina or other inorganic filler materials up to 95 wt %; epoxy-silicone copolymers, filled with silica and/or alumina or other inorganic filler materials up to 95 wt %; glass fibers reinforced epoxy laminates (up to 90 wt %); mixtures of epoxy and silicones, filled and/or unfilled; Polyimide.

The correspondingly formed sandwich-like package including the electronic members 2, 4, the lower carrier 24 supporting, encapsulating and protecting the electronic members 2, 4 from below, and the encapsulation or encapsulation layer 38 encapsulating or covering and protecting the electronic members 2, 4 from above allows the electronic members 2, 4 arranged thereon or therein to be further handled or processed in a protected and safe manner, whereby the risk of damaging the electronic members 2, 4 is reduced.

Figure 2D:
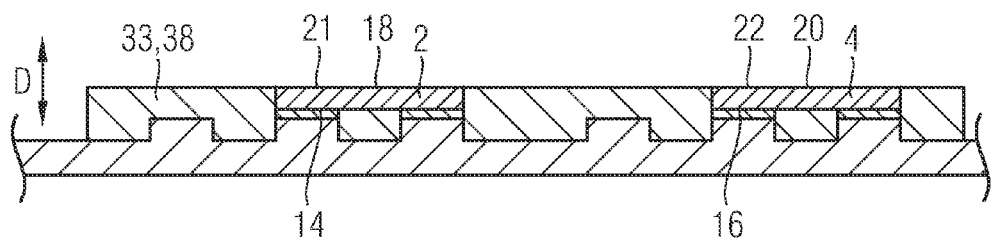

As can be seen from FIG. 2D, the electronic members 2, 4 are reduced in thickness (S600) (cf. thickness direction D in FIG. 2D), for example, by grinding them on their second side 21, 22 opposite to their first side 14, 16 facing the carrier 24. By reducing the thickness of the electronic members 2, 4, the thickness of the encapsulating material 33 and, hence, of the encapsulation 38 or encapsulation layer experiences a corresponding thickness reduction, wherein the second sides 21, 22 of the electronic members 2, 4, including the electric contacts 18, 20 thereon, will become exposed. The surface of the second sides 21, 22 of the electronic members 2, 4 and the corresponding surface of the encapsulation 38 may form a common plane and smooth surface.

Figure 2E:
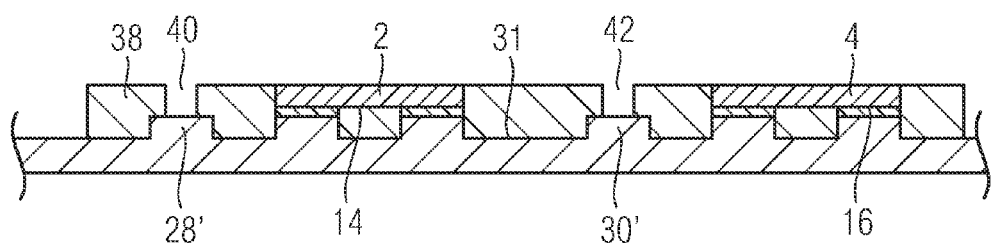

As can be seen from FIG. 2E, at the position of certain ones (for example one or more) projections 28', 30' of certain ones (for example one or more) of the sets of projections 28, 30 (here, at the position of one projection 28', 30' of a respective set of projections 28, 30, wherein, however, it may also be at the position of one or more projections of one or more of the sets of projections 28, 30) a corresponding through hole or via 40, 42 or corresponding through holes or vias 40, 42 may be formed through the encapsulation 38, for example by means of etching or drilling, to thereby expose the corresponding projection 28', 30' (or at least a part thereof) at that side or surface 31 of the carrier 24 facing towards the first side 14, 16 of the electronic members 2, 4 (S700).

Figure 2F:
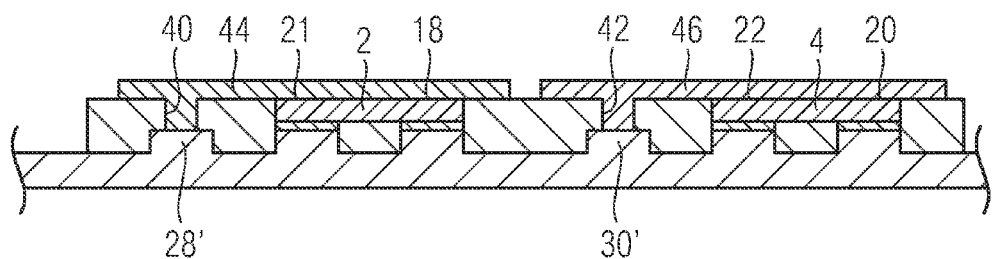

As can be seen from FIG. 2F, a respective metalization or metalization layer 44, 46 is applied (S800) on the second side 21, 22 of each of the electronic members 2, 4 electrically contacting the corresponding electrical contact or electrical contacts 18, 20 provided on said second side 21, 22 of the electronic members 2, 4. The respective metalization 44, 46 extends through the through hole or through holes 40, 42 assigned to the respective electronic member 2, 4 to thereby electrically connect the electrical contact or electrical contacts 18, 22 provided on the second side 21, 22 of the respectively assigned electronic member 2, 4 with the correspondingly assigned projection or projections 28', 30' aligned to or mating the through hole or through holes 40, 42.

Thereby, the electrical connection structure between the electronic members 2, 4 and the correspondingly assigned electrically conductive projections 28', 28", 28'", 30', 30", 30'" may be completed or complete. The respective metalization or metalization layer 44, 46 may have a thickness of several 10 μm to several 100 μm, for example may be in a range from about 10 μm to about 500 μm, for example in a range from about 25 μm to 400 μm, for example in a range from about 50 μm to 300 μm, for example in a range from about 75 μm to 200 μm, wherein the metalization or metalization layer 44, 46 may be of substantially constant thickness or may be of varying thickness with the above-identified thickness range.

Figure 2G:
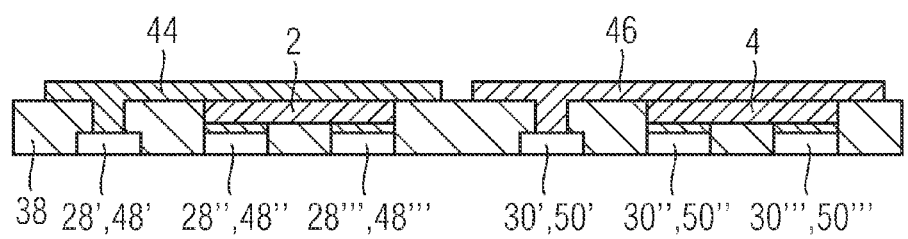

As can be seen from FIG. 2G, after having structured, for example completely structured, the electrical connection between the respective electronic members 2, 4 and the projections 28', 28", 28'", 30', 30", 30'" of the correspondingly assigned set of projections 28, 30, the carrier base 26 is (completely) removed (S900), for example by means of etching or by means of (mechanical) grinding, wherein the electrically conductive projections 28', 28", 28'", 30', 30", 30'" remain as or are usable or are exteriorly accessible as contact terminals 48', 48", 48'" and 50', 50", 50'" for external electrical connection of the electronic device 1. That is, said contact terminals 48', 48", 48'" and 50', 50", 50'" are usable to allow or provide electrical connection of the corresponding electronic member 2, 4 of the respective electronic device 1 to external devices in, for example, an electronic circuit on, for example, a printed circuit board. By removing the carrier base 26, which as mentioned above may be a continuous metal band or a continuous metal sheet, the respective conductive projections 28', 28", 28''', 30', 30", 30''' and correspondingly the corresponding contact terminals 48', 48", 48''' and 50', 50", 50''' may be electrically separated from each other in a manner to provide the intended individual electrical contact or connection structure. In this respect, depending on the desired electrical contact or connection structure or electrical circuit part of the projections 28', 28", 28''', 30', 30", 30''' and, hence, contact terminals 48', 48", 48''' and 50', 50", 50''' may also be formed and/or configured and/or structured such as to be or to stay in an electrical contact with each other.

In the process stage shown in FIG. 2G, the electronic members 2, 4 together with their contact terminals 48', 48", 48''' and 50', 50", 50''' connected thereto via the respective metalization 44, 46 and the remaining encapsulation 38 are still mechanically connected to each other via the remaining encapsulation 38. As can be seen from FIG. 2H, the mechanical connection between the electronic members 2, 4 via the remaining encapsulation 38 may be broken, for example by means of cutting, for example mechanical or laser cutting, or sawing, or braking to thereby individualize (S1000) the respective electronic devices 1 assigned to the respective electronic members 2, 4.

In this respect, the respective electronic device 1 may include one or more electronic members 2, 4, wherein the electronic members may be of same type, for example of semiconductor chip type, e.g. of silicon chip type, or of different types.

Figure 2H:
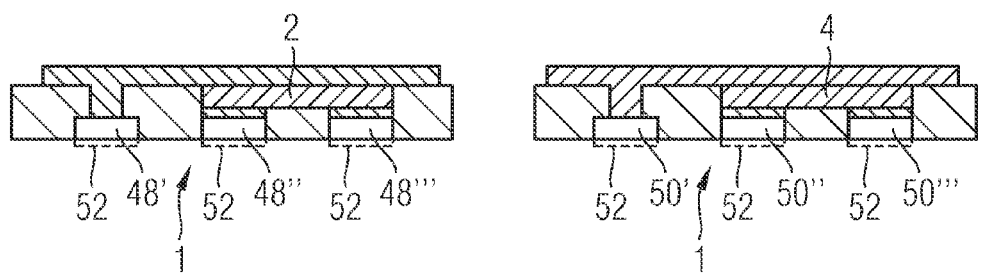

As can be further seen from FIG. 2H, the contact terminals 48', 48", 48''' and 50', 50", 50''' may be provided (S1100) on their exposed side which faces away from the first side of the corresponding electronic member 2, 4 with an electrically conductive cover 52, for example of a solderable material to facilitate electrical connection to an external device.

The final thickness of the electronic member, for example, the electronic member 2, 4 may be equal or less than 60 μm.

In accordance with an embodiment, thinning is carried out after having attached the electronic members 2, 4, such as the chips, with their first side contacts, for example their contacts 6, 8, 10, 1, which may be their front side contacts, to the correspondingly assigned projections 28", 28''', 30", 30'''. In connection with this attaching, the structured projections are simultaneously (electrically) contacted by the first side contacts (front side contacts) of the electronic member(s) 2, 4.

The carrier 24 may be a structured continuous carrier such as a structured metal carrier and may be used as base component. Firstly, the first side chip contacts (front side chip contacts) may be connected to the projections, for example, via soldering. Next, the encapsulation of the chips may be carried out. Next, the thinnening of the chips may be thinned from their back side up to the desired chip thickness, for example equal or less than 60 μm. Next, the through holes may be formed in the encapsulation above the remaining free projections, that is above those projections which are not yet connected to chip contacts. The through holes may be formed by means of laser cutting. Next, the contact metalization, for example of cupper or of a cupper alloy, may be incorporated into the through holes. Next, the removal of the continuous metal layer (below the projections) of the metal carrier may be removed so that the projections are separated from each other and form separate connection terminals at the chip front side. Next, the connection terminals may be provided with the cover of solderable material and may be individualized thereafter. The correspondingly manufactured electronic devices may now be connected to a circuit board.

According to an embodiment the complete manufacture of the electronic device or interconnect device is realized on wafer level, whereby back end processing may be substantially omitted.

According to an embodiment, semiconductor chips, e.g. silicon chips, may be fixedly attached with their front side contacts, for example source and gate contacts) on projections of prestructured metal sheet or metal band. The further complete device manufacture may also be provided on wafer level, for example in manner as discussed above. After having removed the continuous metal band (with remaining the projections on the device(s)), which may be carried out by means of etching, so that the electrical connection terminals on the chip front side are separated from each other, the respective electronic devices may be separated from each other, for example via sawing or laser cutting or any other appropriate way of separation.

Accordingly, a reduced stand-off of the encapsulation mass or encapsulation material may be achieved, whereby an increased device reliability may be achieved. Further, the chips may be attached to the chip carrier or chip carrier before reducing the chip thickness, whereby the risk of damaging the chip when reducing the thickness thereof may be reduced. Further, a reduction of thermal and electrical resistances may be achieved. Further, an improved CTE-compensation between the respective housing materials may be achieved. Furthermore, the device reliability may be improved. Further, the number of process steps may be reduced. Moreover, the manufacturing process may be carried out in a more cost-efficient way.

Figure 3:
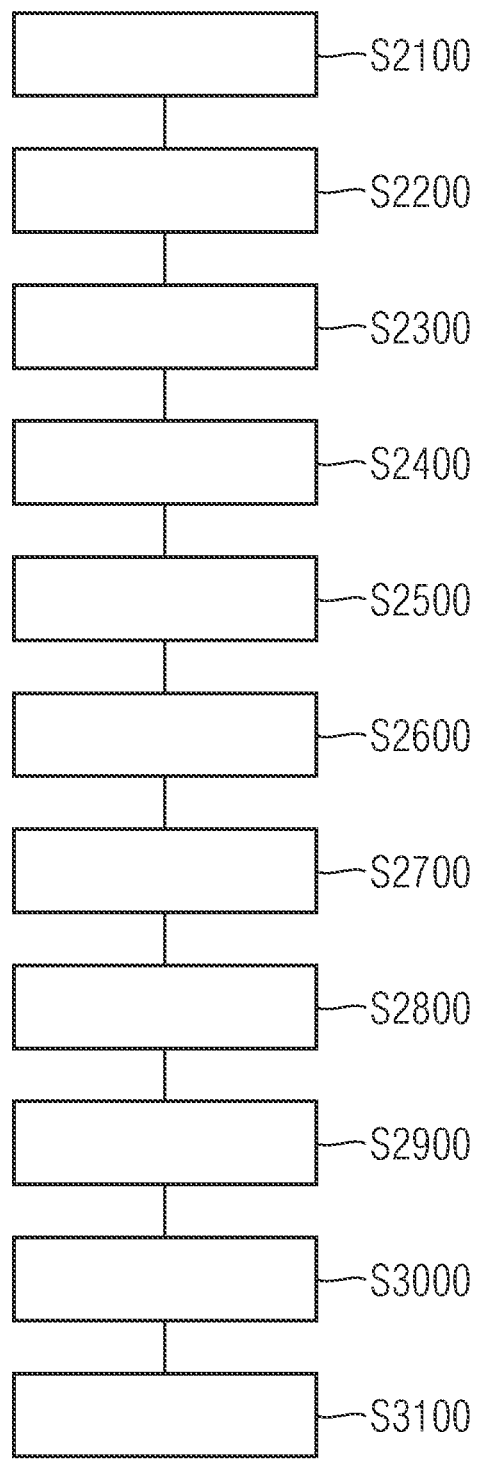
FIG. 3 shows a schematic flow chart describing a process for manufacturing an electronic device according to an embodiment.
Figure 4A:
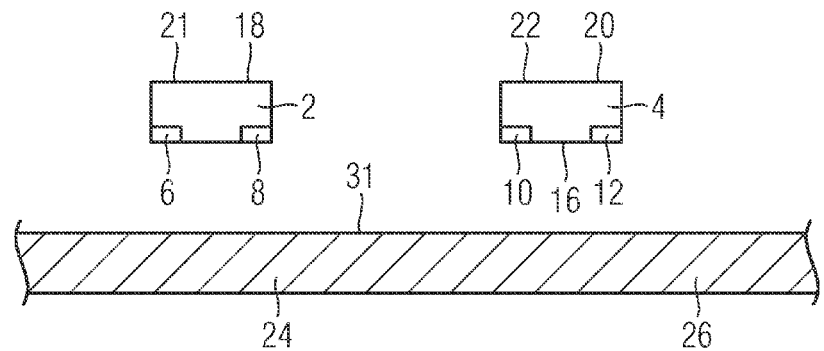
FIGS. 4A-4J show product stages related to the corresponding process stages as described on the basis of FIG. 4.

With reference to FIGS. 3 and 4A to 4, according to a method for manufacturing an electronic device or electronic devices 1 (see FIG. 4H or 4I), for example an electronic interconnect device or electronic interconnect devices, such as one or more semiconductor interconnect devices, e.g. one or more transistors (e.g. including one or more field effect transistors (e.g. one or more Metal Oxide Semiconductor (MOS) transistors), one or more bipolar transistors (e.g. one or more Insulated-Gate Bipolar transistors (IGBT)), and the like), one or more power devices such as e.g. one or more power transistors and/or one or more thyristors, one or more power amplifier devices, and the like, there are provided (S2100) a plurality of electronic members 2, 4, for example in form of chips, for example silicon chips, each having one or more electrical contacts 6, 8 and 10, 12, respectively, on a first electronic member side 14 and 16 (here, first chip side), respectively, thereof, for example source and gate contacts, and each having one or more electrical contacts 18 and 20, for example a drain contact or drain contacts, respectively, on a second electronic member side 21, 22 (here, second chip side) thereof, for example a respective drain contact. Other chip types may be used, for example a chip having one or more electronic interconnect devices as described above. In various embodiments, a logic chip or a memory chip or a chip including a logic portion and a memory portion, may be provided.

Further, there is provided (S2200) a carrier 24 having a lower carrier base 26 and an upper surface 31 below the carrier base 26. In this case, the carrier 24 (and correspondingly the carrier base 26) may be a continuous carrier 24, that is, it may be of a continuous material, for example of a continuous band or continuous sheet material, wherein the carrier 24 may be of an electrically conductive material, such as a metal material, or may be of an electrically non-conductive or dielectric material (cf. FIG. 4A).

The electronic members 2, 4 are attached with their first side 14, 16 to an upper surface 31 of the carrier 24 (S2300). The electronic members 2, 4 may be arranged on the carrier 24 in a single line one after the other, or may be arranged in an array having a structured pattern or may be arranged at arbitrary positions.

Figure 4B:
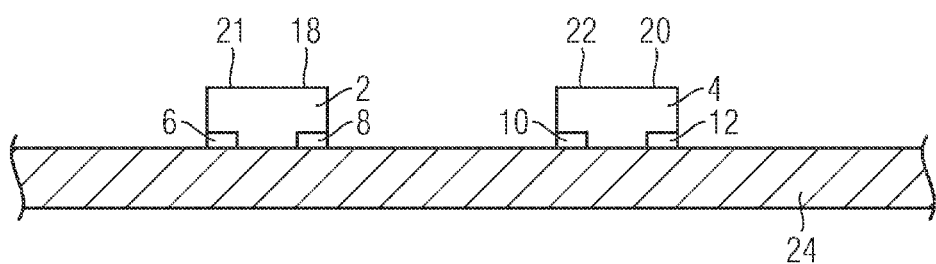
Figure 4C:
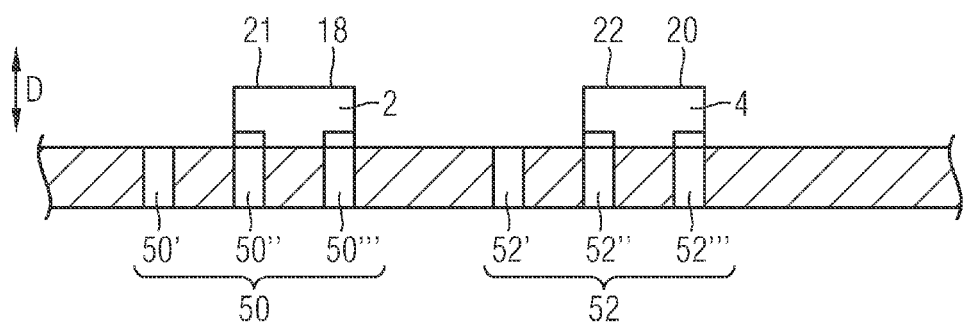

In case the carrier 24 is of an electrically non-conductive material, sets 50, 52 of through holes 50', 50'', 50''', 52', 52'', 52''' may be provided through the carrier 24 (in thickness direction D thereof) at positions 50'', 50''', 52'', 52''' aligned with the electrical contacts 6, 8, 10, 12 of the electronic members 2, 4 to thereby expose the electrical contacts 6, 8, 10, 12, and at positions 50', 52' laterally offset of the electronic members 2, 4 (S2400) (cf. FIG. 4C).

Figure 4D:
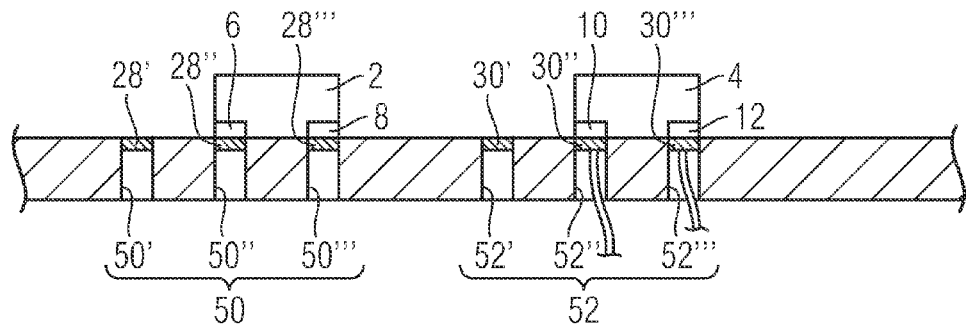
Figure 4A:
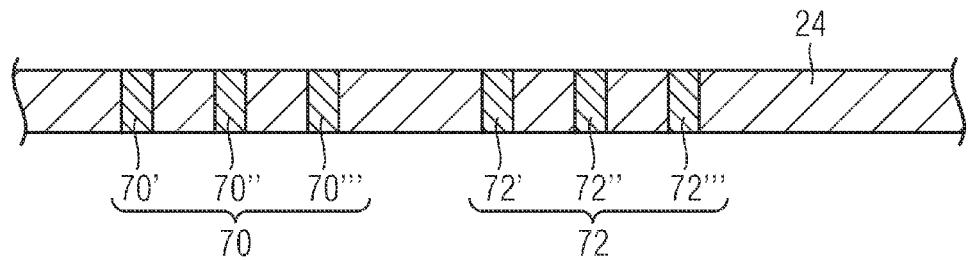
Figure 4B:
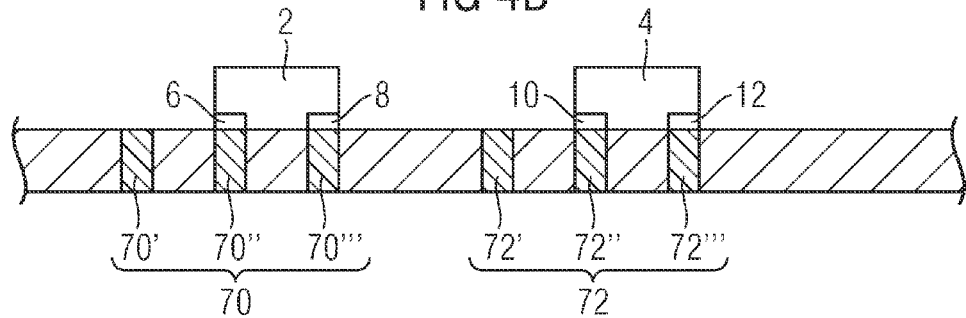
Figure 4B:
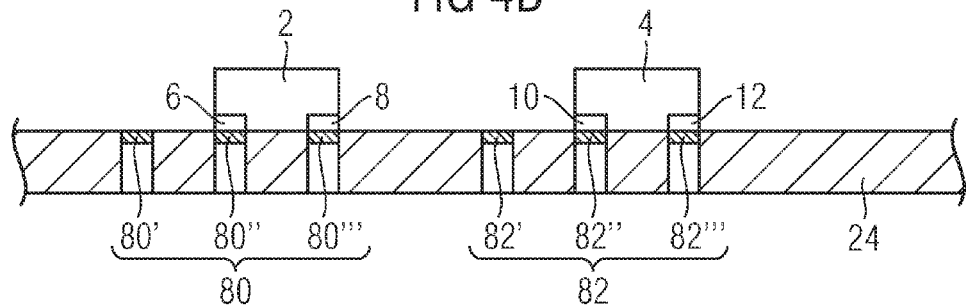

Sets 28, 30 of electrically conductive terminals 28', 28'', 28''', 30', 30'', 30''' may be provided within and/or through the through holes 50', 50'', 50''', 52', 52'', 52''' (cf. FIG. 4D) (S2500), and those 28'', 28''', 30'', 30''' of the electrically conductive terminals 28', 28'', 28''', 30', 30'', 30''' which are respectively assigned to and aligned to the electrical contacts 6, 8, 10, 12 of the electronic members 2, 4 are attached to said electrical contacts 6, 8, 10, 12, for example by means of galvanisation or by soldering (FIG. 4D). The electrically conductive terminals may be formed by means of a galvanization process and/or may be wires 30'', 30'''.

According to FIG. 4D, the electrically conductive terminals 28', 30' which may be provided in those through holes 50', 52' which may be laterally offset of the electronic members 2, 4, and the electrically conductive terminals 28'', 28''' assigned to the electrical contacts 6, 8 of the left side electronic member 2 in FIG. 4D may be formed by means of a galvanisation process, whereas the electrically conductive terminals 30'', 30''' assigned to the electrical contacts 10, 12 of the right side electronic member 4 in FIG. 4D may be in the form of wires.

The through holes 50', 50'', 50''', 52', 52'', 52''' may, for example, be formed by means of etching. To this end, corresponding sets 70, 72 of sacrifice portions 70', 70'', 70''', 72', 72'', 72''' of a sacrifice material may be arranged in the carrier 24 prior to attaching the electronic members 2, 4 on the carrier 24 in a predetermined pattern (cf. FIG. 4A'), and the electronic members 2, 4 may be attached to the carrier 24 in a manner so that the electrical contacts 6, 8, 10, 12 are aligned with the respectively assigned sacrifice portions 70'', 70''', 72'', 72''' of the respectively aligned set 70, 72 of sacrifice portions (cf. FIG. 4B'), wherein there may be sacrifice portions 70', 71' laterally offset of the electronic members 2, 4.

The sacrifice portions 70', 70'', 70''', 72', 72'', 72''' may be of a material of less mechanical and/or chemical resistance than the remaining carrier material so that they may be easily removed from the remaining carrier material by means of, for example, etching to thereby provide the corresponding through holes 50', 50'', 50''', 52', 52'', 52'''.

Instead of sacrifice portions, the electrically non-conductive carrier 24 may be pre-provided with sets 80, 82 of electrically conductive portions 80', 80'', 80''', 82', 82'', 82''' provided in the carrier 24 in a pre-determined arrangement or pattern, and the electronic members 2, 4 may be attached to the upper surface 31 of the carrier 24 with their electrical contacts 6, 8, 10, 12 being aligned to and attached to correspondingly assigned ones 80'', 80''', 82'', 82''' of the electrically conductive portions 80', 80'', 80''', 82', 82'', 82''' in the carrier 24, wherein there may be other ones 80', 82' of the electrically conductive portions 80', 80'', 80''', 82', 82'', 82''' which are laterally offset of the electronic members 2, 4 (cf. FIG. 4B'').

Figure 4E:
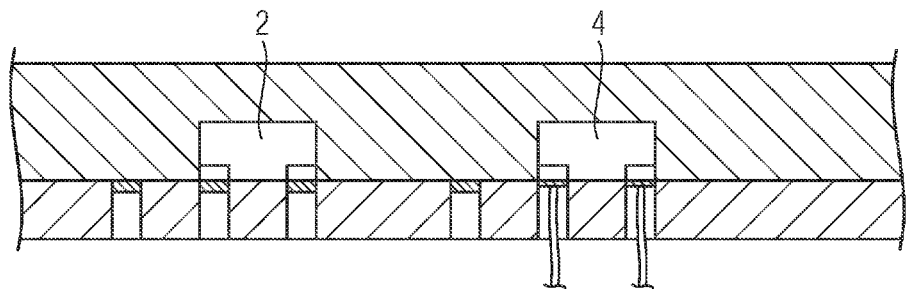

With reference to FIG. 4E, an encapsulating material 33 is applied such as to encapsulate (S2600) exposed portions 36 of the electronic members 2, 4 to form a corresponding encapsulation 38 therearound. The encapsulating material 33 may be a dielectric material such as e.g. epoxy molding compound, filled with silica and/or alumina or other inorganic filler materials up to 95 wt %; epoxy-silicone copolymers, filled with silica and/or alumina or other inorganic filler materials up to 95 wt %; glass fibers reinforced epoxy laminates (up to 90 wt %); mixtures of epoxy and silicones, filled and/or unfilled; Polyimide.

The correspondingly formed sandwich-like package including the electronic members 2, 4, the (lower) carrier 24 supporting, encapsulating and protecting the electronic members 2, 4 from below, and the (upper) encapsulation or encapsulation layer 38 encapsulating or covering and protecting the electronic members 2, 4 from above allows the electronic members 2, 4 arranged thereon or therein to be further handled or processed in a protected and safe manner, whereby the danger of damaging the electronic members 2, 4 may be reduced.

Figure 4F:
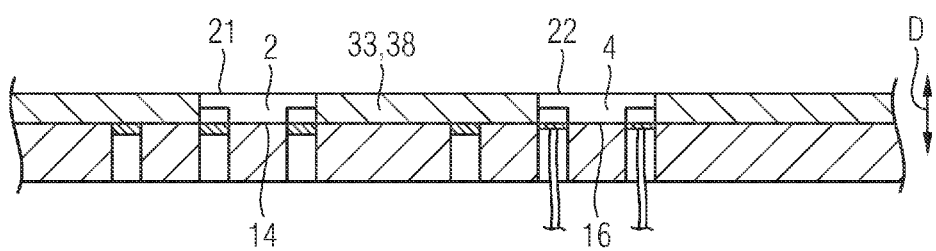

With reference to FIG. 4F, the electronic members 2, 4 may be reduced in thickness (S2700) (cf. thickness direction D in FIG. 4F), for example, by grinding them on their second side 21, 22 opposite to their first side 14, 16 facing the carrier 24. By reducing the thickness of the electronic members 2, 4, the thickness of the encapsulating material 33 and, hence, of the encapsulation 38 or encapsulation layer experiences a corresponding thickness reduction, wherein the second sides 21, 22 of the electronic members 2, 4, including the electric contacts 18, 20 thereon, will become exposed. As mentioned above, after reducing the thickness of the electronic members 2, 4 the second surface 21, 22 of the electronic members 2, 4 and the corresponding surface of the encapsulation 28 may form a smooth and plane single surface.

Figure 4G:
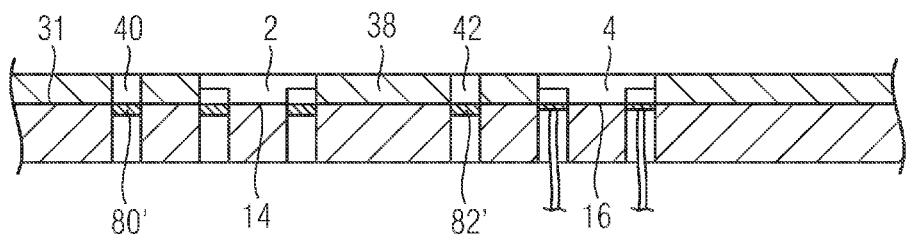

With reference to FIG. 4G, at the position of those electrically conductive terminals 80', 82' laterally offset of the electronic members 2, 4 a corresponding through hole or via 40, 42 or corresponding through holes or vias 40, 42 are formed through the encapsulation 38, for example by means of etching or drilling, (in thickness direction D) to thereby expose the corresponding electrically conductive terminals 80', 82' (or at least a part thereof) at the one side (or the upper surface 31) of the carrier 24 facing towards the first side 14, 16 of the electronic members 2, 4 (S2800).

Figure 4H:
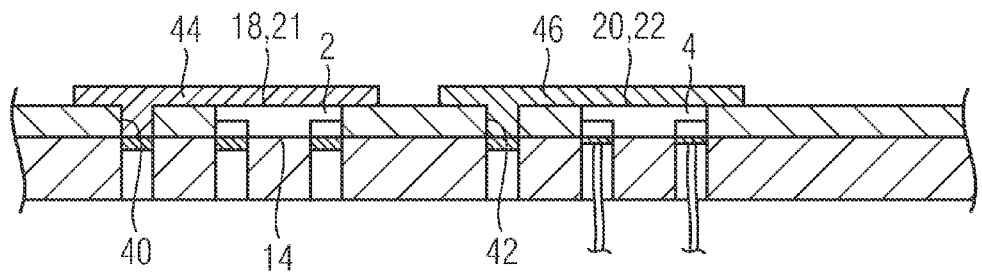

With reference to FIG. 4H, a respective metalization or metalization layer 44, 46 may be applied (S2900) on the second side 21, 22 of each of the electronic members 2, 4 electrically contacting the corresponding electrical contact or electrical contacts 18, 20 provided on said second side 21, 22 of the electronic members 2, 4. The respective metalization 44, 46 extends through the through hole or through holes 40, 42 assigned to and laterally offset of the respective electronic member 2, 4 to thereby electrically connect the electrical contact or electrical contacts 18, 22 provided on the second side 21, 22 of the respectively assigned electronic member 2, 4 with the correspondingly assigned electrically conductive terminal or terminals 80', 82'.

Thereby, the electrical connection structure between the electronic members 2, 4 and the correspondingly assigned electrically conductive terminals 80', 80'', 80''', 82', 82'', 82''' may be completed or complete. The respective metalization or metalization layer 44, 46 may have a thickness of several 10 μm to several 100 μm, for example may be in a range from about 10 μm to about 500 μm, for example in a range from about 25 μm to 400 μm, for example in a range from about 50 μm to 300 μm, for example in a range from about 75 μm to 200

μm, wherein the metalization or metalization layer 44, 46 may be of substantially constant thickness or may be of varying thickness with the above-identified thickness range.

Figure 4I:
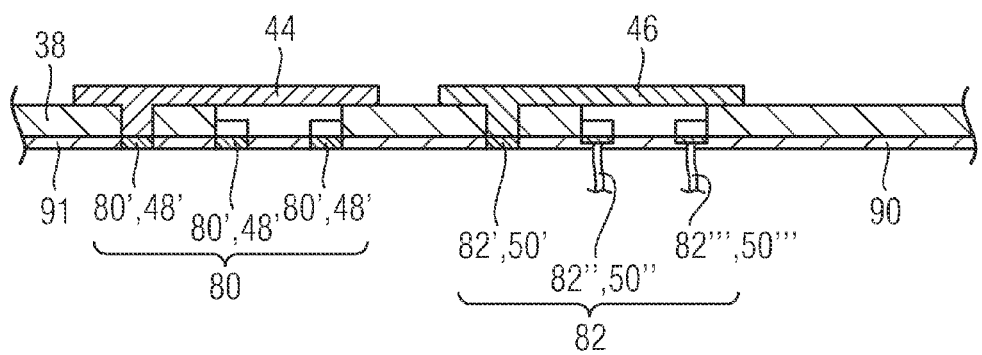

As can be seen from FIG. 4I, after having structured, for example completely structured, the electrical connection between the respective electronic members 2, 4 and the electrically conductive terminals 80', 80", 80'", 82', 82", 82'" of the correspondingly assigned set of electrically conducive terminals 80, 82, the carrier base 26 of the dielectric carrier 24 may be removed (S3000), for example by means of etching or by means of (mechanical) grinding, that a thin upper carrier layer portion 90 of the carrier 24 remains and forms a substantially smooth and even lower surface 91 with those 80', 80", 80'", 82' of the electrically conductive terminals 80', 80", 80'", 82', 82", 82'" which have been provided by means of galvanization. That is, a substantial layer portion, forming the carrier base 26, of the carrier 24 distal from the electronic members 2, 4 is removed, wherein only carrier portions of the carrier 24 lateral of those 80', 80", 80'", 82' of the electrically conductive terminals 80', 80", 80'", 82', 82", 82'", which have been provided by means of galvanization, remain as remaining carrier portion 90 and providing lateral protection and electrical isolation for these electrically conductive terminals 80', 80", 80'", 82'. In this configuration according to FIG. 4I, the electrically conductive terminals 80', 80", 80'", 82', 82" remain as or are usable as or are exteriorly accessible as contact terminals 48', 48", 48'" and 50', 50", 50'" for external electrical connection of the electronic device 1. That is, said contact terminals 48', 48", 48'" and 50', 50", 50'" are usable to allow or provide electrical connection of the corresponding electronic member 2, 4 of the respective electronic device 1 to external devices in, for example, an electronic circuit on, for example, a printed circuit board.

In the process stage shown in FIG. 4I, the electronic members 2, 4 together with their contact terminals 48', 48", 48'" and 50', 50", 50'" connected thereto via the respective metalization 44, 46 and the remaining encapsulation 38 are still mechanically connected to each other via the remaining encapsulation 38 and the remaining carrier portion 90.

Figure 4J:
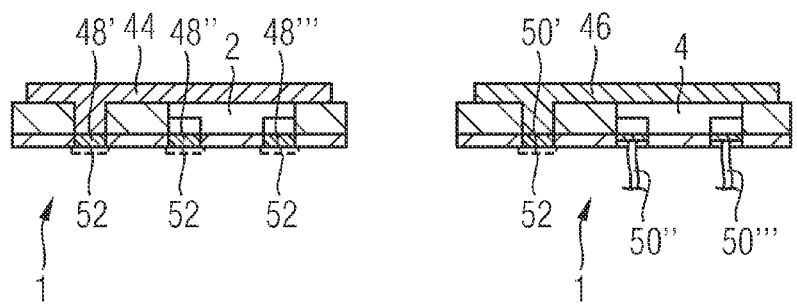

With reference to FIG. 4J, the mechanical connection between the electronic members 2, 4 via the remaining encapsulation 38 and the remaining carrier portion 90 may be broken, for example by means of cutting, for example mechanical or laser cutting, or sawing, or breaking to thereby individualize (S3100) the respective electronic devices 1 assigned to the respective electronic members 2, 4.

In this respect, the respective electronic device 1 may comprise one or more electronic members 2, 4, wherein the electronic members may be of same type, for example of semiconductor chip type, e.g. silicon chip type, or of different types. As can be further seen from FIG. 4J, those 48', 48", 48'", 50' of the contact terminals 48', 48", 48'", 50' which have been provided by means of galvanization, may be provided (S3200) on their exposed side which faces away from the first side of the corresponding electronic member 2, 4 with an electrically conductive cover 52, for example of a solderable material to facilitate electrical connection to an external device. The final thickness of the electronic member, for example, the electronic member 2, 4 may be equal or less than 60 μm.

With reference to all of the above-discussed embodiments, the following additional aspects may apply (individually or in any combination). The carrier may have a thickness in the range of at least 10 μm, e.g. of 10 μm to 1 mm. The one or more or all of the electronic members may be chips, and the chips may be silicon chips. Further, the encapsulating material may be a dielectric material. Further, reducing the electronic members in thickness may comprise reducing the encapsulation or the encapsulating material in thickness. Further, electrically conductive terminals may be formed on the carrier in areas laterally offset of the electronic members, wherein the electrically conductive terminals may be projections of the electrically conductive projections on the carrier. Through holes may be formed in the encapsulation in a thickness direction thereof, the through holes respectively mating those electrically conductive terminals or projections, which are arranged laterally offset of the electronic members, to thereby expose the said electrically conductive terminals or projections. A contact metallization may be provided, which extends through the through holes to electrically contact the correspondingly exposed electrically conductive terminals or projections. The contact metallization may contact one or more electrical contacts provided on a second side of the electronic members. The carrier base may be of a continuous material. The carrier may be of a sheet or band material. The carrier may be of a metal material. The carrier, which may, for example, be a substrate, may be made of a ceramic material, and/or may be a foil and/or may be a lead frame. The electrical contacts of the respective electronic member may be attached to the respective set of electrically conductive terminals by means of soldering, e.g. diffusion soldering, or sintering or nano pastes or electrically conductive glues, wherein the electrically conductive terminals themselves may be provided by the soldering, e.g. diffusion soldering, (or the corresponding soldering material), sintering (or the corresponding sintering material), or nano pastes or electrically conductive glues. One or more or all of the electronic members may have their one side provided with a plurality of electrical contacts arranged in a predetermined contact pattern, and wherein the electrically conductive terminals or projections of the corresponding set of terminals or projections of the carrier are arranged in a terminal or projection pattern, respectively, corresponding to the contact pattern. The electrical contacts on the one side of the respective silicon chip may include source and gate contacts. A second side of the respective chip may be provided with an electrical contact in form of a drain contact. The projections may be provided with a metallization on a side facing away from the first side of the electronic member. The carrier may be provided with sets of one or more through holes, respectively assigned to the sets of one or more electrically conductive terminals, wherein the sets of one or more electrically conductive terminals are provided through the respectively assigned through holes of said sets of one or more through holes in the carrier, wherein (the) electrically conductive terminals may be formed through the through holes via a galvanization process. The carrier may be provided with sets of one or more sacrifice material portions, respectively assigned to the sets of one or more through holes, wherein after attaching the electronic members to the carrier, the sacrifice portions are removed to thereby form the correspondingly assigned sets of one or more through holes. The process of encapsulating may be carried out by means of laminating so that the encapsulation may be a laminate. The encapsulation material may be a glass fiber or carbon fiber reinforced plastic, or may be (pure) glass component. The encapsulating process may also include underfilling to reach cavities between diverse parts, for example between the electronic member(s) and the carrier, wherein also pre-underfilling may be applied. The reducing process may include grinding and/or etching and/or laser etching and/or any other process allowing appropriate removal of material. In case the carrier remains, the carrier may be further treated, for example, finished, e.g. gold coated. The carrier base may be a continuous material. The carrier may be of a sheet material or of a band material. The carrier may comprise or is of an electrically conductive material. The electrically conductive terminals may be formed through the through holes (provided in the carrier) via a galvanization process.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. Further, the dependent claims may not only refer back to individual previous claims, but the respective dependent claim may also refer back to anyone of the respective previous claims, and each dependent claim may also refer back to anyone of the independent claims and the corresponding depending claims so that the corresponding diverse combinations of claims are correspondingly disclosed in this application.

The invention further provides an electronic device or electronic devices formed by applying the methods as described herein.

For example, an electronic device is provided which comprised a carrier having a lower carrier base and an upper surface above the carrier base; electronic members each having one or more electrical contacts on a first member side thereof, the electronic members being attached with the first member side thereof to the upper surface of the carrier; sets of one or more electrically conductive terminals, respectively assigned to the electronic members, wherein the electrical contacts of the respective electronic member are correspondingly electrically connected to the electrically conductive terminals of the correspondingly assigned set of electrically conductive terminals; an encapsulation of an encapsulating material encapsulating exposed portions of the electronic members with an encapsulating. In the electronic device the carrier may have sets of one or more electrically conductive projections on the upper surface of the carrier, wherein the electronic members may be attached to the upper surface of the carrier in a manner so that the electronic members are attached with the corresponding electrical contacts thereof to the respective set of projections to thereby electrically connect the one or more electrical contacts of the respective electronic member with the corresponding one or more electrically conductive projections of the respective set, the sets of attached projections providing the sets of electrically conductive terminals. Further in the electronic device, the one or more or all of the electronic members may be (electronic) chips. Further in the electronic device, the carrier base and the electrically conductive projections may be of one-piece structure.

An electronic device may be provided, comprising a plurality of electronic chips having source and gate contacts on a respective first side thereof, an electrically conductive carrier formed from a continuous carrier base, from a first side of which metal projections extend, which are arranged in a structure so as to be aligned with the source and gate contacts on the respective first side of the plurality of electronic chips which are placed on the carrier, an encapsulating layer on the first side of the carrier encapsulating the chips, through holes in the encapsulating layer on the first side of the carrier exposing corresponding ones of the projections on the first side of the carrier, separated metallization layers on the encapsulation layer which respectively electrically contact both the exposed projections through the through holes and a drain contact on the second side of the chips. In the electronic device, the carrier may a metal sheet or metal band.

What is claimed is:

1. A method for manufacturing an electronic device, the method comprising:
   providing a plurality of electronic members, each of the plurality of electronic members comprising one or more electrical contacts on a first member side;
   providing a carrier comprising a lower carrier base and an upper surface above the carrier base, wherein the upper surface comprises a plurality of electrically conductive projections and wherein the lower carrier base and the electrically conductive projections are of an one-piece structure;
   attaching the plurality of electronic members to the carrier with the first member side of each of the plurality of electronic members to the upper surface of the carrier, wherein at least one electrical contact of each of the plurality of electronic members is electrically connected to one of the plurality of electrically conductive projections;
   forming an encapsulation, comprising encapsulating one or more exposed portions of the plurality of electronic members with an encapsulating material; and
   reducing the thickness of each of the plurality of electronic members.

2. The method of claim 1, further comprising
   removing at least the carrier base from the carrier so that the electrically conductive projections remain or are exteriorly accessible as contact terminals for external electrical connection of the electronic device.

3. The method of claim 1,
   wherein at least one of the electronic members is a chip.

4. The method of claim 1,
   wherein reducing the thickness of each of the plurality of electronic members comprises reducing the encapsulating material in thickness.

5. The method of claim 1, wherein one or more of the electrically conductive projections are arranged laterally offset from one or more of the plurality of electronic members.

6. The method of claim 5, further comprising:
   forming one or more through holes, wherein each of the one or more formed through holes each extend from a top surface of the encapsulation to one of the electrically conductive projections that are arranged offset from one or more of the plurality of electronic members to thereby respectively expose one of the electrically conductive projections arranged offset from one or more of the electronic members.

7. The method of claim 6, further comprising,
   providing one or more contact metallizations each respectively extending through one of the through holes to electrically and connecting with one of the exposed electrically conductive projections.

8. The method of claim 7,
   wherein at least one of the one or more contact metallizations connect with one or more electrical contacts provided on a second side of one of the plurality of electronic members.

9. The method of claim 1,
   wherein the one or more of electrical contacts on a first member side of at least one of the plurality of electronic members are arranged in a predetermined contact pattern, and wherein one or more of the electrically conductive projections are arranged in a projection pattern corresponding to the contact pattern.

10. The method of claim 1,
wherein one or more of the plurality of electrical conductive projections comprise a metallization on a side facing away from the first side of the electronic member.

11. A method for producing an electronic device, the method comprising:
 forming a carrier from a continuous carrier base, the carrier being electrically conductive and comprising a plurality of metal projections at a first side of the carrier;
 placing on the carrier, a plurality of electronic chips, each of the plurality of electronic chips comprising at least a source contact and a gate contact on the first side of the carrier, wherein the source and gate contacts are aligned so as to mate with the metal projections;
 encapsulating the plurality of electronic chips, comprising providing an encapsulating layer on at least the first side of the carrier;
 reducing the thickness of the encapsulating layer on the first side of the carrier and reducing the thickness of the plurality of the electronic chips on the first side of the carrier;
 providing one or more through holes in the encapsulating layer on the first side of the carrier to expose at least one of the plurality of the metal projections on the first side of the carrier; and
 providing one or more metallization layers on the encapsulation layer to respectively electrically contact both one of the exposed metal projections through the through holes and one of the drain contacts on the second side of one of the plurality of electronic chips.

12. The method of clam 11, further comprising
removing at least the carrier base of the carrier.

13. A method for manufacturing an electronic device, the method comprising:
 providing a plurality of electronic members, each of the plurality of electronic members comprising one or more electrical contacts on a first member side;
 providing a carrier comprising a lower carrier base and an upper surface above the lower carrier base, and further comprising one or more sacrifice portions extending through the carrier from the upper surface to a corresponding opposite lower surface;
 attaching the plurality of electronic members with the first member side to the upper surface of the carrier so that one or more of the sacrifice portions are respectively aligned with one of the one or more electrical contacts of the plurality of the electronic members;
 removing one or more of the sacrifice portions from the carrier to thereby form one or more through holes in the carrier;
 providing one or more electrically conductive terminals each respectively within one of the one or more through holes to electrically contact one of the one or more electrical contacts of the plurality of electronic members;
 forming an encapsulation, comprising encapsulating one or more exposed portions of the plurality of the electronic members with an encapsulating material; and
 removing at least the lower carrier base from the carrier with the one or more electrically conductive terminals remaining or being exteriorly accessible as contact terminals for external electrical connection of the electronic device.

14. The method of claim 13, further comprising:
reducing the thickness of at least one of the plurality of electronic members.

* * * * *